(12) United States Patent
    Hidai et al.

(10) Patent No.: US 11,126,147 B2
(45) Date of Patent: Sep. 21, 2021

(54) PORTABLE ELECTRONIC DEVICE

(71) Applicant: SEIKO EPSON CORPORATION, Tokyo (JP)

(72) Inventors: Yoshihiro Hidai, Shiojiri (JP); Tsutomu Taniguchi, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 398 days.

(21) Appl. No.: 16/289,946

(22) Filed: Mar. 1, 2019

(65) Prior Publication Data
    US 2019/0271953 A1    Sep. 5, 2019

(30) Foreign Application Priority Data
    Mar. 2, 2018  (JP) .............. JP2018-037273

(51) Int. Cl.
    *G04G 19/00*    (2006.01)
    *H01L 31/068*   (2012.01)
    *H01L 31/028*   (2006.01)
    *H01L 31/042*   (2014.01)
    *G04G 17/04*    (2006.01)
    *H05K 5/03*     (2006.01)
    (Continued)

(52) U.S. Cl.
    CPC .............. *G04G 19/00* (2013.01); *G04G 17/04* (2013.01); *H01L 31/028* (2013.01); *H01L 31/042* (2013.01); *H01L 31/068* (2013.01); *H02S 99/00* (2013.01); *H05K 5/0017* (2013.01); *H05K 5/0086* (2013.01); *H05K 5/03* (2013.01)

(58) Field of Classification Search
    CPC ...... G04G 19/00; G04G 17/04; H01L 31/028; H01L 31/042; H01L 31/068; H01L 31/055; H01L 31/048; H02S 99/00; H05K 5/0017; H05K 5/0086; H05K 5/03; G04C 10/02; G04B 19/12; Y02E 10/52
    USPC ........................................... 368/205
    See application file for complete search history.

(56) References Cited

U.S. PATENT DOCUMENTS 6,094,404 A * 7/2000 Hidai ............. G04C 10/02
                                                    368/205
    6,822,157 B2   11/2004 Fujioka
                     (Continued)

FOREIGN PATENT DOCUMENTS

JP    H11-264881 A    9/1999
    JP    2003-124491 A   4/2003
    JP    2017-138169 A   8/2017

*Primary Examiner* — Edwin A. Leon
(74) *Attorney, Agent, or Firm* — Oliff PLC

(57) ABSTRACT

A portable electronic device includes an outer case having an opening, a cover member having light transmission properties and covering the opening, and a monocrystalline silicon type solar cell accommodated in the outer case, and in which the cover member and the monocrystalline silicon type solar cell overlap each other in a plan view when seen from a thickness direction of the cover member, and the cover member and the monocrystalline silicon type solar cell are joined with a light transmissive adhesive. Furthermore, it is preferable that a display member accommodated in the outer case and displaying information is further included, the monocrystalline silicon type solar cell is provided between the display member and the cover member, and the display member is joined to the monocrystalline silicon type solar cell.

18 Claims, 7 Drawing Sheets

(51) Int. Cl.
*H05K 5/00* (2006.01)
*H02S 99/00* (2014.01)

(56) References Cited

U.S. PATENT DOCUMENTS

| | | | |
|---|---|---|---|
| 8,467,272 B2* | 6/2013 | Fujisawa | G04C 10/02 |
| | | | 368/47 |
| 9,823,625 B2* | 11/2017 | Abe | G04R 20/04 |
| 2016/0065122 A1* | 3/2016 | Chen | H01L 31/048 |
| | | | 136/251 |

* cited by examiner

PORTABLE ELECTRONIC DEVICE

CROSS-REFERENCES TO RELATED APPLICATIONS

This application claims priority to Japanese Patent Application No. 2018-037273, filed on Mar. 2, 2018, the entirety of which is herein incorporated by reference.

BACKGROUND

1. Technical Field

The present invention relates to a portable electronic device.

2. Related Art

A portable electronic device such as a timepiece on which a solar cell is mounted is known. For example, in JP-A-11-264881, a timepiece which includes a case including a windshield glass, a dial plate displaying time, and a solar cell made of amorphous silicon is disclosed. In such a timepiece, the solar cell is disposed between the windshield glass and the dial plate.

As a solar cell, a solar cell made of amorphous silicon and a solar cell made of monocrystalline silicon are known. The solar cell made of monocrystalline silicon is brittle compared to the solar cell made of amorphous silicon, but has high power conversion efficiency. For that reason, from a viewpoint of power conversion efficiency, it is desired to use a solar cell made of monocrystalline silicon.

However, when the solar cell made of monocrystalline silicon is used as the solar cell of the timepiece described in JP-A-11-264881, there is a possibility that the solar cell may be damaged when an impact is applied to the timepiece. For that reason, when the solar cell made of monocrystalline silicon is mounted on the portable electronic device such as a wristwatch, impact resistance of the portable electronic device is lowered.

SUMMARY

A portable electronic device according to an aspect of the invention includes an outer case having an opening, a cover member having light transmission properties and covering the opening, a monocrystalline silicon type solar cell accommodated in the outer case, and in which the cover member and the monocrystalline silicon type solar cell overlap each other in a plan view when seen from a thickness direction of the cover member, and the cover member and the monocrystalline silicon type solar cell are joined with a light transmissive adhesive.

In the portable electronic device according to the aspect of the invention, since the cover member and the solar cell are joined with an adhesive, durability against impact of the solar cell, that is, impact resistance can be enhanced, as compared with a case where the cover member and the solar cell are not joined with the adhesive. For that reason, the impact resistance of the portable electronic device can be enhanced.

In the portable electronic device according to the aspect of the invention, it is preferable that a display member accommodated in the outer case and displaying information is further included, the monocrystalline silicon type solar cell is provided between the display member and the cover member, and the display member is joined to the monocrystalline silicon type solar cell.

According to the portable electronic device of the aspect of the invention with this configuration, since the solar cell is joined to both the cover member and the display member, rigidity of a structure in which the solar cell is joined to both the cover member and the display member can be increased as compared with rigidity of the solar cell. For that reason, the impact resistance of the solar cell can be further enhanced. Since the solar cell is joined to the cover member and the display member, the cover member, the solar cell, and the display member can be handled altogether in assembling the portable electronic device. For that reason, it is possible to easily assemble the portable electronic device.

In the portable electronic device according to the aspect of the invention, it is preferable that an intermediate material having light transmission properties is provided between the cover member and the display member.

According to the portable electronic device of the aspect of the invention with this configuration, since the intermediate material is provided, the rigidity of the structure can be made higher than the rigidity of the solar cell. Since a glass member may be reinforced by the intermediate material, the thickness of the cover member can be made thinner. In addition, it is possible to reduce fogging of the cover member due to dew condensation, as compared with a case where a region is a space.

In the portable electronic device according to the aspect of the invention, it is preferable that a difference between an absolute refractive index of the intermediate material and an absolute refractive index of the cover member is smaller than a difference between an absolute refractive index of air and the absolute refractive index of the cover member.

According to the portable electronic device of the aspect of the invention with this configuration, since a larger amount of light can be guided to the solar cell as compared with the case where the intermediate material is not provided and a portion between the cover member and the display member is a space, a light receiving amount by the solar cell can be increased.

In the portable electronic device according to the aspect of the invention, it is preferable that the monocrystalline silicon type solar cell includes a first monocrystalline silicon type solar cell and a second monocrystalline silicon type solar cell, and the first monocrystalline silicon type solar cell and the second monocrystalline silicon type solar cell are separated from each other.

According to the portable electronic device of the aspect of the invention with this configuration, it is possible to reduce the possibility that the first solar cell and the second solar cell are damaged by contact with each other as the cover member deforms due to thermal expansion or the like.

In the portable electronic device according to the aspect of the invention, it is preferable that the difference between the absolute refractive index of the adhesive and the absolute refractive index of the cover member is smaller than the difference between the absolute refractive index of air and the absolute refractive index of the cover member.

According to the portable electronic device of the aspect of the invention with this configuration, since a larger amount of light can be guided to the solar cell as compared with the case where the adhesive is not provided and a portion between the cover member and the solar cell is a space, the light receiving amount by the solar cell can be increased.

In the portable electronic device according to the aspect of the invention, it is preferable that a circuit board accommodated in the outer case and a battery accommodated in the outer case are further included and the battery is provided on a side opposite to the cover member with respect to the circuit board.

According to the portable electronic device of the aspect of the invention with this configuration, it is possible to set a position of the center of gravity of the portable electronic device on a side opposite to the cover member with the circuit board interposed therebetween. For that reason, wearability on the user can be enhanced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
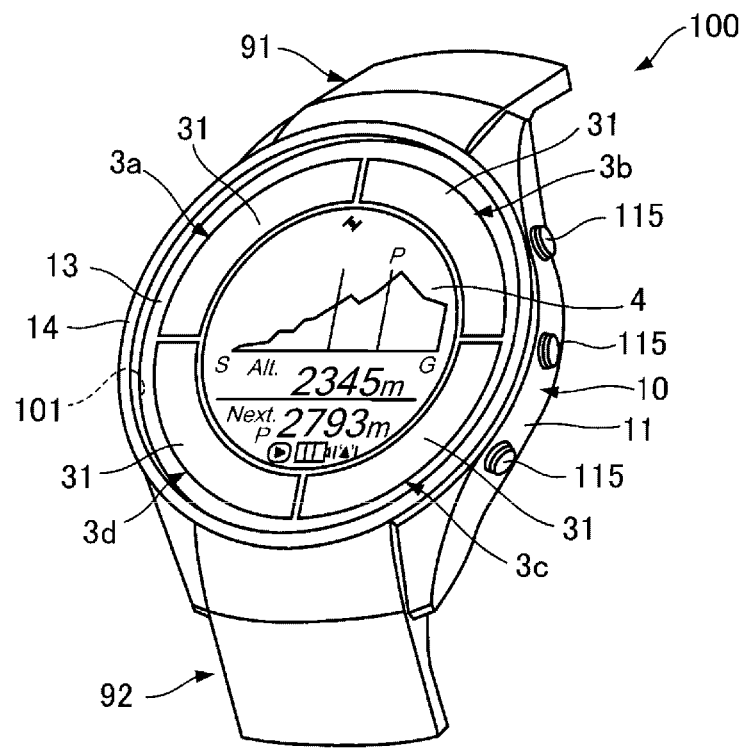
FIG. 1 is a perspective view of a portable electronic device according to a first embodiment when seen from the front side thereof.

Hereinafter, preferred embodiments of the invention will be described with reference to the accompanying drawings. In the drawings, dimensions and scales of respective portions are appropriately different from actual ones. In the following description, the scope of the invention is not limited to these embodiments unless otherwise stated to the effect of limiting the invention. Also, in this specification, the term "parallel" is not limited to perfect parallel but also includes a case where two objects are inclined with respect to each other within a range of ±5°.

First Embodiment

1. Basic Configuration

Figure 2:
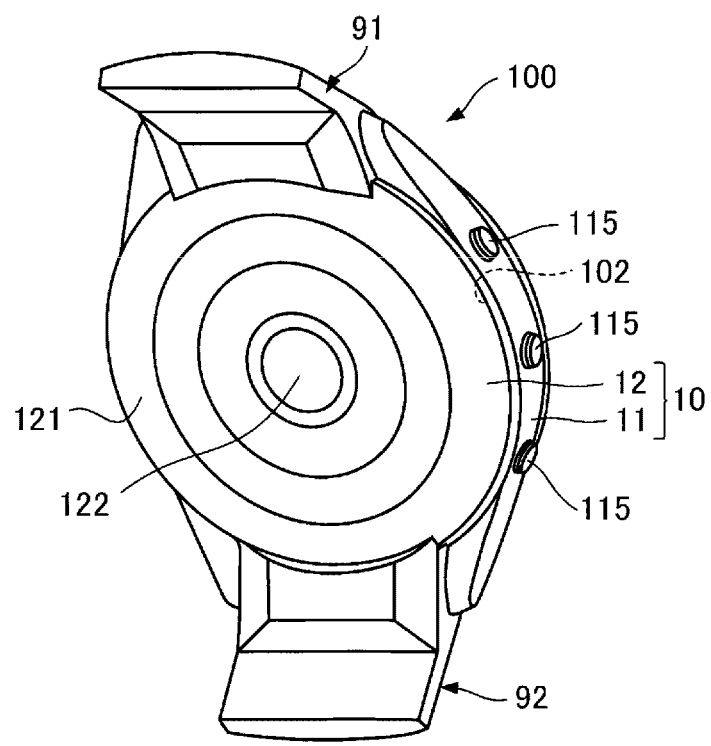
FIG. 2 is a perspective view of the portable electronic device illustrated in FIG. 1 when seen from the back side thereof.
Figure 3:
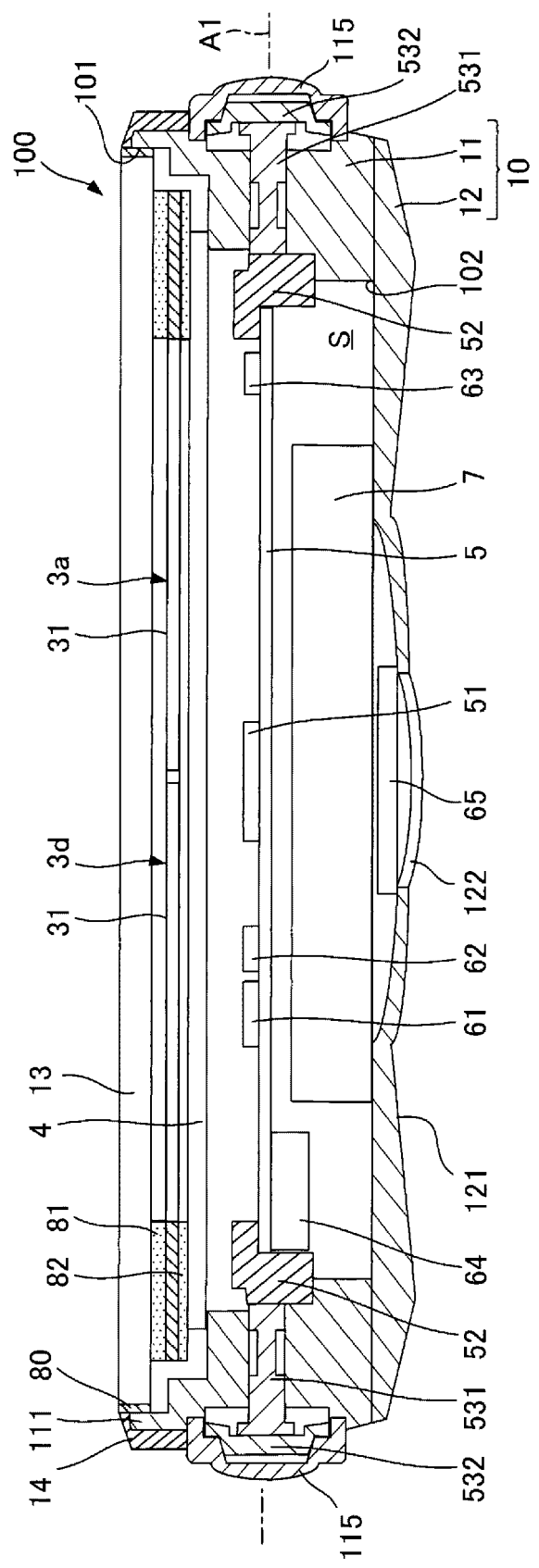
FIG. 3 is a cross-sectional view of the portable electronic device illustrated in FIG. 1.

FIG. 1 is a perspective view of a portable electronic device according to a first embodiment when seen from the front side thereof. FIG. 2 is a perspective view of the portable electronic device illustrated in FIG. 1 when seen from the back side thereof. FIG. 3 is a cross-sectional view of the portable electronic device illustrated in FIG. 1.

A portable electronic device 100 illustrated in FIGS. 1, 2 and 3 is a wristwatch type wrist device that can be worn on the user's wrist and has a function of displaying information such as time.

The portable electronic device 100 includes an outer case 10 including an opening 101 that is open on the front side, a cover member 13 that covers the opening 101, a pair of belts 91 and 92 that are attached to the outer case 10 and used to be worn on a user as mounting members. As illustrated in FIG. 3, in an inner space S surrounded by the outer case 10 and the cover member 13, a display member 4, a circuit board 5, an acceleration sensor 61, and an azimuth sensor 62 configured by a magnetic sensor, a wireless communication antenna 63, a GPS antenna 64, a pulse sensor 65, and a secondary battery 7 are accommodated. In addition, a first solar cell 3a, a second solar cell 3b, a third solar cell 3c, and a fourth solar cell 3d are accommodated in the inner space S (see FIGS. 1 and 3). Hereinafter, each unit included in the portable electronic device 100 will be briefly described.

In the portable electronic device 100, the side shown in FIG. 1 on which the user visually recognizes information such as time in a state of being worn on the user's wrist, is referred to as the "front side". In addition, the side shown in FIG. 2 which contacts the user's wrist, is referred to as the "backside". Further, in this specification, the plan view refers to seeing from the thickness direction of the cover member 13 having a flat plate shape. Hereinafter, in a case where the first solar cell 3a, the second solar cell 3b, the third solar cell 3c, and the fourth solar cell 3d are not distinguished, it is called a solar cell 3.

1a. External Configuration of Portable Electronic Device

As illustrated in FIG. 3, the outer case 10 includes a barrel 11 having a cylindrical shape and aback lid 12 covering one of the two openings 101 and 102 of the barrel 11. On the front side of the barrel 11, a protruded portion 111 protruding upward is formed. A plurality of buttons 115 that can be pressed by a user are provided on the barrel 11. The user can give instructions and the like about various display contents to the portable electronic device 100 using the buttons 115. The outer surface of the back lid 12 forms a contact surface 121 that comes in contact when the portable electronic device 100 is worn on the user's wrist. On the back lid 12, a window 122 having light transmission properties is formed.

The constituent materials of the barrel 11 and the back lid 12 are not particularly limited, and for example, glass materials, various resin materials including plastics such as acrylic resin and polycarbonate resin, and metal materials such as stainless steel may be included. The outer case 10 is configured by two members of the barrel 11 and the back lid 12, but may be configured by three or more members, or may be configured by one member.

As illustrated in FIG. 3, the cover member 13 is a member having a thickness, and is configured by a member having light transmission properties. The shape of the cover member 13 can be appropriately selected from a flat plate shape, a spherical shape, or the like according to application of the portable electronic device 100. The cover member 13 is disposed inside the protruded portion 111. The cover member 13 is fixed to the protruded portion 111 by an annular bezel 14 provided on the outer periphery of the protruded portion 111. A seal 80 such as an annular packing or the like is interposed in a joint portion between the cover member 13 and the protruded portion 111. The portion between the cover member 13 and the protruded portion 111 is sealed by the seal 80. Waterproofness of the inner space S is secured by the seal 80.

As the constituent material of the cover member 13, any material may be used as long as it has light transmission properties, and although not particularly limited, for example, glass materials, sapphire glass, various resin materials including plastics such as acrylic resin and polycarbonate resin, and the like may be included. The light transmission properties refer to an electromagnetic wave contributing to power generation of the solar cell 3, for example, transmission properties to visible light, ultraviolet rays, or infrared rays. Particularly, in the portable electronic device 100, since it is necessary to be able to visually recognize the display member accommodated in the outer case 10, light transmission properties to visible light is required. As the constituent material of the bezel 14, for example, various resin materials and metal materials such as stainless steel may be included. The constituent material of the seal 80 is not particularly limited, and, for example, various resin materials such as silicone rubber, thermoplastic elastomer and fluorine resin may be included.

A belt 91 and a belt 92 are detachably attached to the barrel 11. As the constituent material of the belts 91 and 92 are not particularly limited, for example, various resin materials, metal materials such as stainless steel, and the like may be used.

1b. Internal Configuration of Portable Electronic Device

Each of the first solar cell 3a, the second solar cell 3b, the third solar cell 3c, and the fourth solar cell 3d has a function of converting energy of light such as sunlight into electric power, and is configured by a panel having a light receiving surface 31. The light receiving surface 31 faces the cover member 13 side. The solar cell 3 is joined to the cover member 13 by a first adhesive 81 which is an adhesive having light transmission properties. Further, the thickness direction of the solar cell 3 is parallel to the thickness direction of the cover member 13 described above.

The display member 4 having a flat plate shape is disposed in a region on the back side of the solar cell 3. The display member 4 is joined to the solar cell 3 by a second adhesive 82. The display member 4 is configured by, for example, a display such as a liquid crystal panel, an electronic paper panel, an organic electroluminescence panel or the like. The display member 4 is electrically connected to the circuit board 5 via wiring (not illustrated) or the like. For example, the display member 4 displays various information such as position information and time information of the portable electronic device 100 (see FIG. 1). The thickness direction of the display member 4 is parallel to the thickness direction of the cover member 13. The solar cell 3, the first adhesive 81 and the second adhesive 82 will be described later in detail.

The circuit board 5 is disposed in a region on the back side of the display member 4. The circuit board 5 has a function of controlling drive of each unit included in the portable electronic device 100, and includes, for example, a micro processing unit (MPU) 51 or the like. A plurality of switches 52 are electrically connected to the circuit board 5. The switches 52 are provided corresponding to the buttons 115 described above, and receive operations of the buttons 115 by the user. Each switch 52 is connected to each button 115 via a shaft 531 made of a metal material and a button base 532 made of a resin material.

On the circuit board 5, the acceleration sensor 61, the azimuth sensor 62, the wireless communication antenna 63, and the GPS antenna 64 are mounted. The acceleration sensor 61 is configured to include, for example, an acceleration sensor element manufactured using the MEMS technology, and has a function of measuring acceleration applied to the portable electronic device 100 in three axes. The azimuth sensor 62 is configured by a magnetic sensor including a Hall element for detecting magnetism and its signal processing circuit, and measures a direction in which the portable electronic device 100 is facing. The wireless communication antenna 63 has a wireless communication function and transmits various data to, for example, an external personal computer (not illustrated). As a wireless communication method of the wireless communication antenna 63, for example, a wireless local area network (LAN) including Wi-Fi (registered trademark) and a short-range wireless communication method such as Bluetooth (registered trademark) may be included. Further, the GPS antenna 64 has a function of receiving global positioning system (GPS) satellite signals.

The secondary battery 7 is disposed in a region on the back side of the circuit board 5. The secondary battery 7 is charged by electric power from the solar cell 3 and supplies electric power to each portion and the like mounted on the circuit board 5. As a specific example of such a secondary battery 7, for example, a lithium ion secondary battery or the like may be included.

The pulse sensor 65 configured by a photoelectric sensor is provided in a region on the back side of the secondary battery 7. The pulse sensor 65 is disposed at a position capable of receiving light transmitted through a window 122 of the back lid 12. The pulse sensor 65 measures the pulse of the user by utilizing a phenomenon in which reflectance of light differs between when the blood vessel expands and when the blood vessel contracts. Although not illustrated in detail, the pulse sensor 65 includes a light emitting element such as an LED and a light receiving element such as a photodiode. Light from the light emitting element is transmitted through the window 122 and the wrist of the user is irradiated with the light, and light reflected by the user is transmitted through the window 122 and is received by the light receiving element.

Each unit of the portable electronic device 100 has been briefly described as above. In the illustration, the shape of the outer case 10 in a plan view is substantially circular, but the shape of the outer case 10 in a plan view is not limited thereto, and may be, for example, a quadrangular shape or the like. The sensors included in the portable electronic device 100 are not limited to the acceleration sensor 61, the azimuth sensor 62, and the pulse sensor 65 described above. For example, although not illustrated, the portable electronic device 100 may include various sensors such as an atmospheric pressure sensor for measuring atmospheric pressure outside the portable electronic device 100, a temperature sensor for measuring external temperature, a gyro sensor for measuring an angular velocity applied to the portable electronic device 100. The acceleration sensor 61, the azimuth sensor 62, and the pulse sensor 65 may be omitted. Further, the wireless communication antenna 63 and the GPS antenna 64 may be omitted.

2. Solar Cell, First Adhesive, and Second Adhesive

Figure 4:
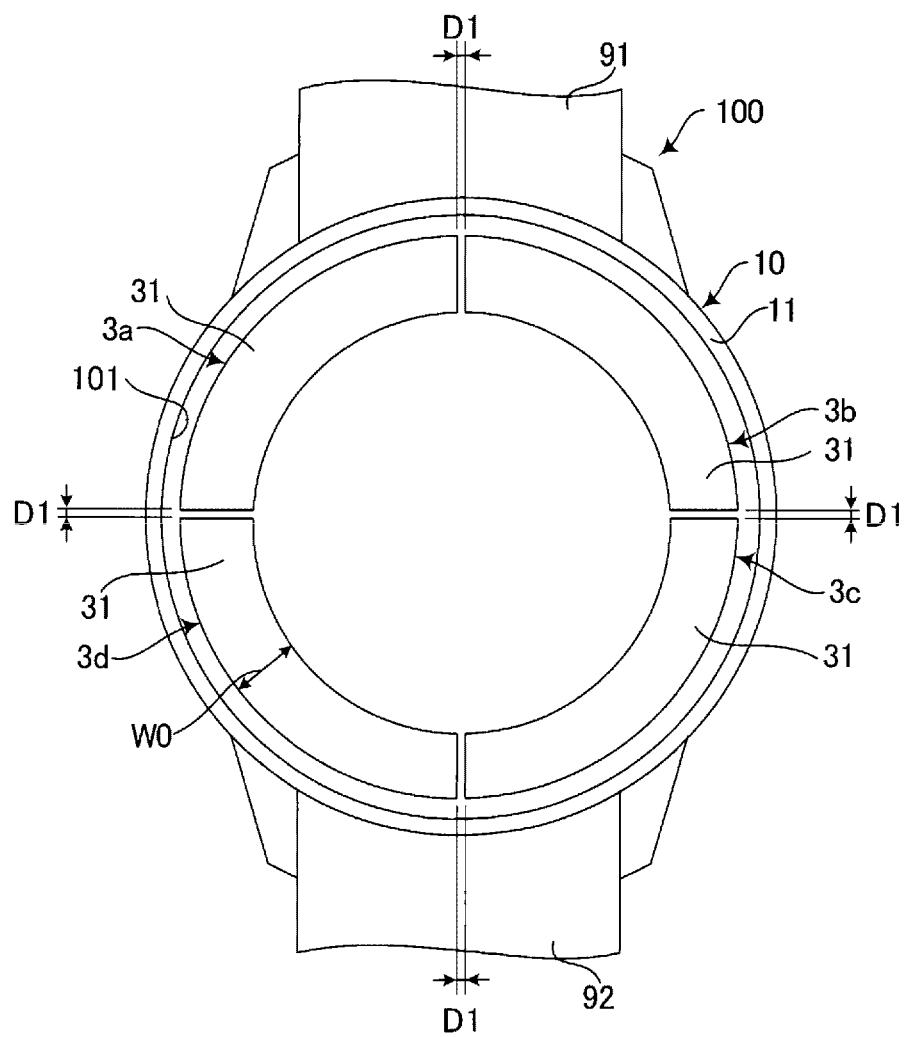
FIG. 4 is a plan view illustrating a disposition of a solar cell included in the portable electronic device illustrated in FIG. 1.
Figure 5:
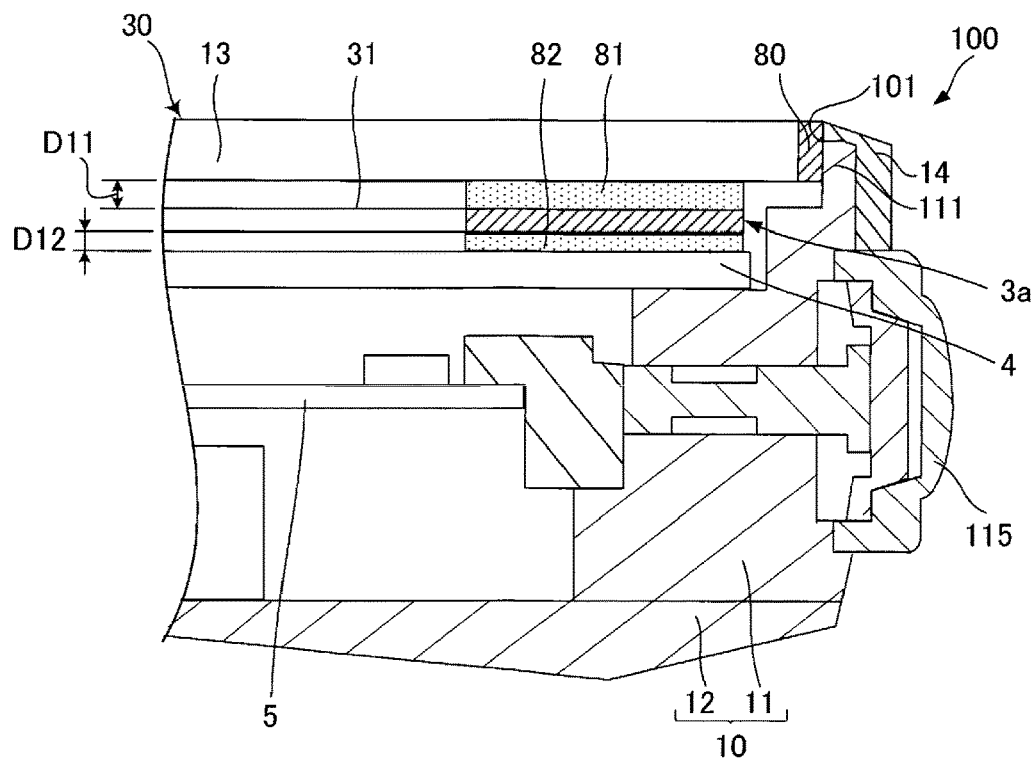
FIG. 5 is a partial cross-sectional view of the portable electronic device illustrated in FIG. 1.
Figure 6:
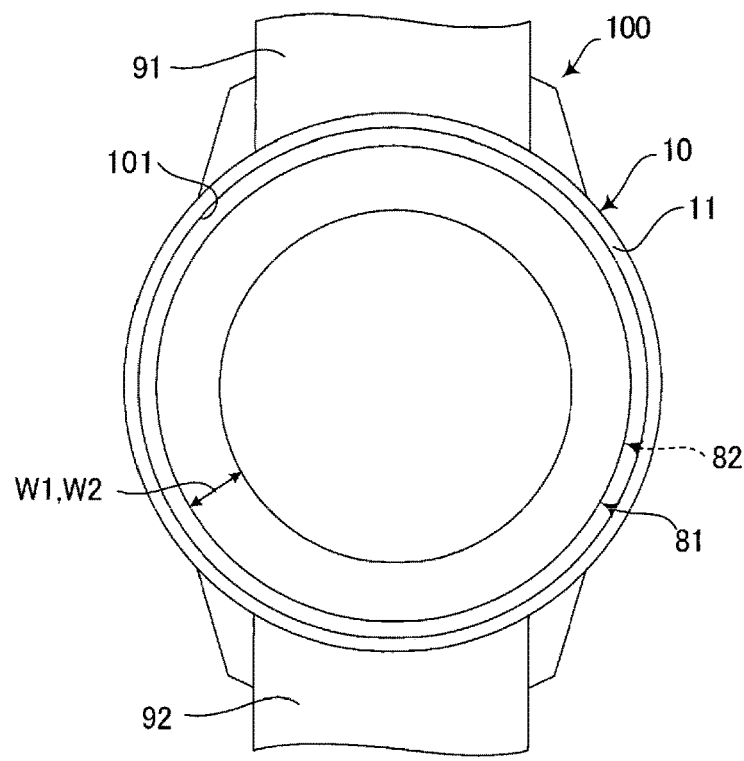
FIG. 6 is a plan view illustrating a disposition of a first adhesive included in the portable electronic device illustrated in FIG. 1.

Next, the solar cell 3, the first adhesive 81, and the second adhesive 82 will be described in detail. FIG. 4 is a plan view illustrating a disposition of a solar cell included in the portable electronic device illustrated in FIG. 1. FIG. 5 is a partial cross-sectional view of the portable electronic device illustrated in FIG. 1. FIG. 6 is a plan view illustrating a disposition of a first adhesive and a second adhesive included in the portable electronic device illustrated in FIG.

1. In FIG. 6, illustration of the solar cell 3 disposed between the first adhesive 81 and the second adhesive 82 is omitted. Although attention is paid on the first solar cell 3a in FIG. 5, the same applies to the second solar cell 3b, the third solar cell 3c, and the fourth solar cell 3d.

As illustrated in FIG. 4, a plurality of solar cells 3 (3a, 3b, 3c, and 3d) are disposed in the outer case 10. The plurality of solar cells 3 are arranged side by side in a ring shape in a plan view while being spaced apart with a gap Dl. Each solar cell 3 has a shape along a circular arc. In addition, sizes of the gaps Dl may be different from each other, or may be equal to each other.

The solar cell 3 is a monocrystalline silicon type solar cell, and is configured to include monocrystalline silicon. The solar cell 3 is, for example, a monocrystalline silicon type solar cell using pn junction.

As illustrated in FIG. 5, the solar cell 3 (3a) overlaps the cover member 13 in a plan view and is joined to the cover member 13 by the first adhesive 81. The first adhesive 81 is in the form of a sheet, and is made of, for example, a double-sided adhesive sheet. In this specification, adhesion is a concept including stickiness. The solar cell 3 may be peelably joined so that the solar cell 3 can be joined to the cover member 13 again by the first adhesive 81, or may be joined so as not to be peeled off.

The first adhesive 81 overlaps the solar cell 3 and the cover member 13 in a plan view and fills a gap D11 between the solar cell 3 and the cover member 13. The plan view shape of the first adhesive 81 corresponds to the plan view shape of the solar cell 3 and is annular (see FIGS. 4 and 6). The width W1 of the first adhesive 81 illustrated in FIG. 6 is equal to the width W0 of the solar cell 3 illustrated in FIG. 4. Further, as illustrated in FIG. 4, the outer peripheral edge of the first adhesive 81 is positioned inside the outer peripheral edge of the cover member 13 in a plan view.

As illustrated in FIG. 5, the solar cell 3 overlaps the display member 4 in a plan view and is joined to the display member 4 by the second adhesive 82. Accordingly, the solar cell 3 is disposed between the cover member 13 and the display member 4, and is joined to both the cover member 13 and the display member 4. A structure 30 is configured by the solar cell 3, the first adhesive 81, the cover member 13, the second adhesive 82, and the display member 4.

The second adhesive 82 is in the form of a sheet, and is made of, for example, a double-sided adhesive sheet. The solar cell 3 may be peelably joined so that the solar cell 3 can be joined to the display member 4 again by the second adhesive 82, or may be joined so as not to be peeled off.

The second adhesive 82 overlaps the solar cell 3 and the display member 4 in a plan view and fills a gap D12 between the solar cell 3 and the display member 4. As illustrated in FIG. 6, the plan view shape of the second adhesive 82 is the same as the plan view shape of the first adhesive 81. Therefore, similar to the first adhesive 81, the shape of the second adhesive 82 in a plan view corresponds to the plan view shape of the solar cell 3, and is annular (see FIGS. 4 and 6). The width W2 of the second adhesive 82 is equal to the width W1 of the first adhesive 81 and is equal to the width W0 of the solar cell 3. The second adhesive 82 overlaps the first adhesive 81 and the solar cell 3 in a plan view.

The first adhesive 81 is an adhesive having light transmission properties and insulation properties. The constituent material of the first adhesive 81 is not particularly limited as long as it is a material having light transmission properties, but is preferably curable resin, and more preferably ultraviolet curable resin. The curable resin is generally preferable because the curable resin has better heat resistance than plastic resin. In addition, the ultraviolet curable resin is generally preferable because the ultraviolet curable resin can be cured in a shorter time than thermoplastic resin, which makes it easier to manufacture. As the specific ultraviolet curable resin, for example, (meth) acrylic acid alkyl ester, fluorinated epoxy resin, fluorinated epoxy acrylate resin, and the like may be included. The first adhesive 81 containing such resin is preferable because the first adhesive 81 is easy to handle and the solar cell 3 can be joined particularly stably to the cover member 13 and the display member 4. Further, the first adhesive 81 may be in a semi-cured state or a semi-solidified state as well as in a state of being cured or solidified.

The second adhesive 82 is an adhesive having insulation properties. The constituent material of the second adhesive 82 is not particularly limited, but is preferably curable resin, more preferably light transmitting resin and ultraviolet curable resin. The curable resin is generally preferable because the curable resin has better heat resistance than plastic resin. By using the second adhesive 82 as the light transmitting resin, the first adhesive 81 and the second adhesive 82 can be made of the same material. In addition, the ultraviolet curable resin is generally preferable because the ultraviolet curable resin can be cured in a shorter time than thermoplastic resin, which makes it easier to manufacture. As specific ultraviolet curable resin, for example, (meth) acrylic acid alkyl ester, fluorinated epoxy resin, fluorinated epoxy acrylate resin, and the like may be included. The second adhesive 82 including such resin is preferable because the second adhesive 82 is easy to handle and the solar cell 3 can be joined particularly stably to the cover member 13 and the display member 4. The constituent materials of the first adhesive 81 and the second adhesive 82 may be the same as each other or may be different from each other. In addition, the second adhesive 82 may be in a semi-cured or semi-solidified state as well as in a state of being cured or solidified.

As illustrated in FIGS. 3 and 5, the portable electronic device 100 described above includes the outer case 10 having the opening 101, the cover member 13 having light transmission properties and covering the opening 101, and the solar cell 3 accommodated in the outer case 10 and configured to include monocrystalline silicon. In addition, the cover member 13 and the solar cell 3 overlap each other in a plan view when seen from the thickness direction of the cover member 13, and the cover member 13 and the solar cell 3 are joined with the first adhesive 81 which is a light transmissive adhesive.

According to the portable electronic device 100, since the cover member 13 and the solar cell 3 are joined to each other by the first adhesive 81, as compared with the case where the cover member 13 and the solar cell 3 are not joined with the first adhesive 81, durability against the impact of the solar cell 3, that is, impact resistance can be enhanced. For that reason, the impact resistance of the portable electronic device 100 can be enhanced. If there is a space between the cover member 13 and the first adhesive 81, there is a possibility that when impact is applied to the outer case 10, the solar cell 3 and the cover member 13 collide with each other due to the impact and the solar cell 3 may be damaged. In contrast, in this embodiment, since the cover member 13 and the solar cell 3 are joined with the first adhesive 81, the first adhesive 81 functions as an impact absorbing material or a reinforcing material, so that the possibility of breakage of the solar cell 3 can be reduced or prevented.

Furthermore, since the cover member 13 and the solar cell 3 are joined with the first adhesive 81, compared to the case where the cover member 13 and the solar cell 3 are not joined with the first adhesive 81, damage due to external pressure (for example, water pressure) of the solar cell 3 can be reduced. If there is a space between the cover member 13 and the first adhesive 81, there is a possibility that external pressure is applied to the outer case 10 so that the cover member 13 is deformed and the solar cell 3 is damaged. In contrast, in this embodiment, since the cover member 13 and the solar cell 3 are joined with the first adhesive 81, the first adhesive 81 functions as an impact absorbing material or a reinforcing material, so that the possibility of breakage of the solar cell 3 can be reduced or prevented.

Since the first adhesive 81 is a double-sided adhesive sheet, the first adhesive 81 is easy to handle, and it is possible to join to a portion to be joined with high accuracy. Therefore, individual differences can be reduced.

Furthermore, as described above, the portable electronic device 100 is accommodated in the outer case 10 and includes the display member 4 for displaying information. The display member 4 is joined to the solar cell 3.

Since the display member 4 is joined to the solar cell 3, the solar cell 3 is joined to both the cover member 13 and the display member 4. For that reason, rigidity of the structure 30 can be made higher than rigidity of the solar cell 3. Therefore, the impact resistance of the solar cell 3 can be further enhanced. Since the solar cell 3 is joined to the cover member 13 and the display member 4, the cover member 13, the solar cell 3, and the display member 4 can be handled altogether in assembling the portable electronic device 100. For that reason, it is possible to easily assemble the portable electronic device 100.

Furthermore, as described above, the cover member 13, the solar cell 3, and the display member 4 overlap each other in a plan view and are disposed to be aligned in this order along the thickness direction of the cover member 13. The solar cell 3 is provided between the display member 4 and the cover member 13. According to this disposition, it is possible to increase the rigidity of the structure 30 as compared with a case where the solar cell 3 is not provided between the cover member 13 and the display member 4.

As described above, the portable electronic device 100 includes the plurality of solar cells 3, and the first solar cell 3a (first monocrystalline silicon type solar cell) and the second solar cell 3b (second monocrystalline silicon type solar cell) among the plurality of solar cells 3 are separated from each other. In particular, in this embodiment, the portable electronic device 100 includes the first solar cell 3a, the second solar cell 3b, the third solar cell 3c, and the fourth solar cell 3d, and the first solar cell 3a, the second solar cell 3b, the third solar cell 3c, and the fourth solar cell 3d are separated from each other.

According to such a disposition, even if there is a difference in the coefficient of thermal expansion between the cover member 13 and the solar cell 3 and the plurality of solar cells 3 are deformed by deformation due to thermal expansion of the cover member 13, it is possible to reduce or prevent contact between the plurality of solar cells 3. In addition, it is possible to reduce or prevent contact between the plurality of solar cells 3 due to vibration of the outer case 10.

Although the first solar cell 3a is the "first monocrystalline silicon type solar cell" and the second solar cell 3b is the "second monocrystalline silicon type solar cell", for example, the third solar cell 3c and the fourth solar cell 3d may be regarded as a "first monocrystalline silicon type solar cell" and a "second monocrystalline silicon type solar cell", respectively, and the second solar cell 3b and the fourth solar cell 3d and may be regarded as the "first monocrystalline silicon type solar cell" and the "second monocrystalline silicon type solar cell", respectively. That is, it suffices that at least any two of the plurality of solar cells 3 are separated. However, as in this embodiment, it is preferable that any two adjacent ones of the plurality of solar cells 3 are separated from each other. According to this aspect, it is possible to effectively reduce or prevent contact between the solar cells 3.

As described above, it is preferable that the difference between the absolute refractive index of the first adhesive 81 which is an adhesive and the absolute refractive index of the cover member 13 is smaller than the difference between the absolute refractive index of air and the absolute refractive index of the cover member 13.

By satisfying such a relationship, compared to the case where the first adhesive 81 is not provided and the portion between the cover member 13 and the solar cell 3 is a space, a larger amount of light can be guided to the solar cell 3, so that the amount of light received by the solar cell 3 can be increased.

The difference between the absolute refractive index of the first adhesive 81 and the absolute refractive index of the cover member 13 is preferably 0.3 or less, and more preferably 0.1 or less. When the difference value is equal to or less than the values described above, the effect of increasing the amount of received light described above can be exerted particularly remarkably. For example, when the constituent material of the cover member 13 is a glass material and the absolute refractive index of the cover member 13 is 1.5, the absolute refractive index of the first adhesive 81 is preferably 1.2 or more and 1.8 or less and more preferably 1.4 or more and 1.6 or less. In the example described above, it is particularly preferable that the absolute refractive index of the first adhesive 81 is 1.5. The absolute refractive index of air is 1.00003.

The portable electronic device 100 includes the circuit board 5 accommodated in the outer case 10 and the secondary battery 7 as a "battery" accommodated in the outer case 10. The secondary battery 7 is provided on the side opposite to the cover member 13 with respect to the circuit board 5.

Here, in the portable electronic device 100, the weight on the side of the cover member 13 tends to be heavier than the central axis A1 as much as the first adhesive 81 and the second adhesive 82 are provided. For that reason, it is easy to separate from the user's wrist. Therefore, as illustrated in FIG. 3, in the portable electronic device 100, by providing the secondary battery 7 on a side opposite to the cover member 13 with the circuit board 5 interposed therebetween, the center of gravity of the portable electronic device 100 is positioned closer to the back lid 12 than the central axis A1. With this configuration, wearability of the portable electronic device 100 on the user can be improved. The center axis A1 is a line passing through the center of the portable electronic device 100 in the thickness direction and orthogonal to the thickness direction.

The portable electronic device 100 may include a primary battery (not illustrated) instead of the secondary battery 7 as a battery. A plurality of batteries may also be included. In that case, both the secondary battery 7 and the primary battery may be included.

The portable electronic device 100 has been described as above. A disposition of the solar cell 3 is not limited to the disposition illustrated in the drawing and may be arbitrary. However, it is preferable that the solar cell 3 is disposed so as not to hinder user's visual recognition of display by the display member 4. Further, in the solar cell 3, one or more and three or less of the first solar cell 3a, the second solar cell 3b, the third solar cell 3c, and the fourth solar cell 3d may be omitted, and furthermore, the solar cell 3 may have another solar cell such as a fifth solar cell. Further, for example, in a case where the solar cell 3 is configured by one annular solar cell, it is preferable that a slit is formed so as to reduce a possibility of breakage.

In this embodiment, the case where the first adhesive 81 is in the form of a sheet is described as an example, but the first adhesive 81 may be formed using a liquid adhesive. Even if the cover member 13 or the solar cell 3 has irregularities, the irregularities can be filled by using the liquid adhesive. For that reason, by using the liquid member in the case where the cover member 13 or the solar cell 3 has irregularities, adhesion properties between the solar cell 3 and the cover member 13 can be enhanced as compared with the case of using the sheet-like first adhesive 81. The same applies to the second adhesive 82.

Second Embodiment

Figure 7:
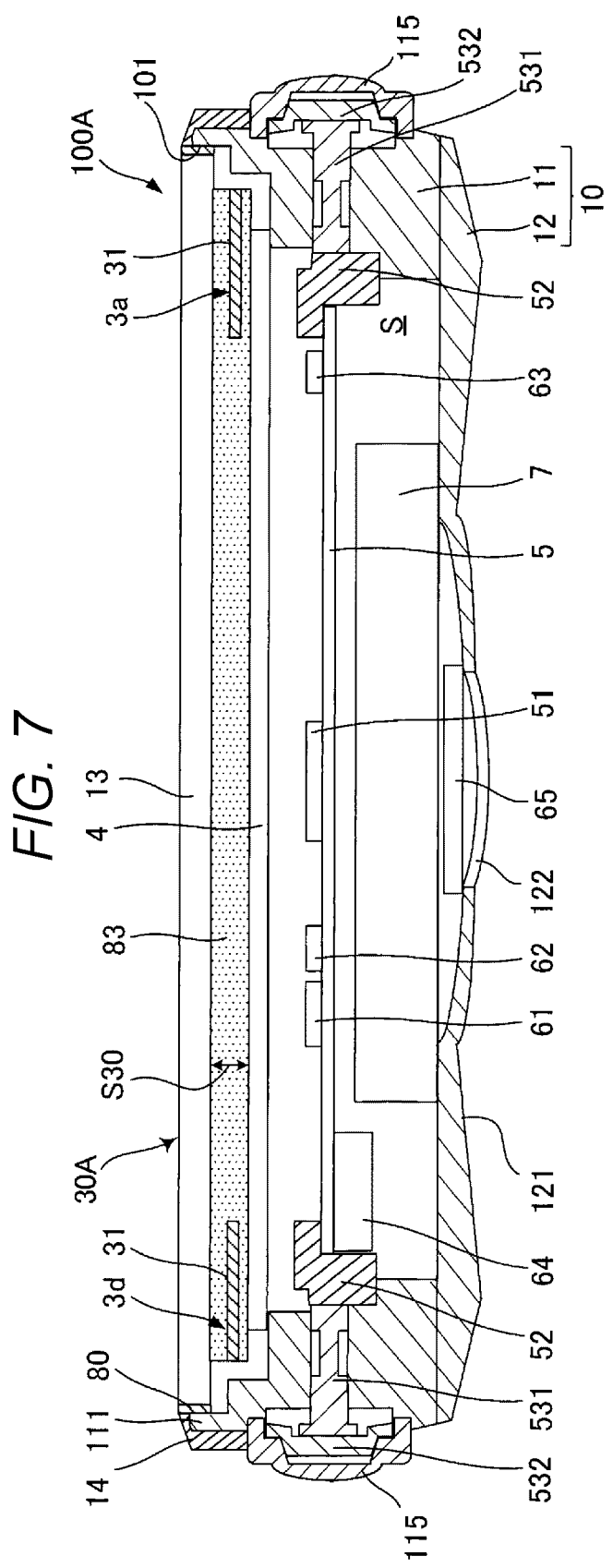
FIG. 7 is a cross-sectional view of a portable electronic device according to a second embodiment.
Figure 8:
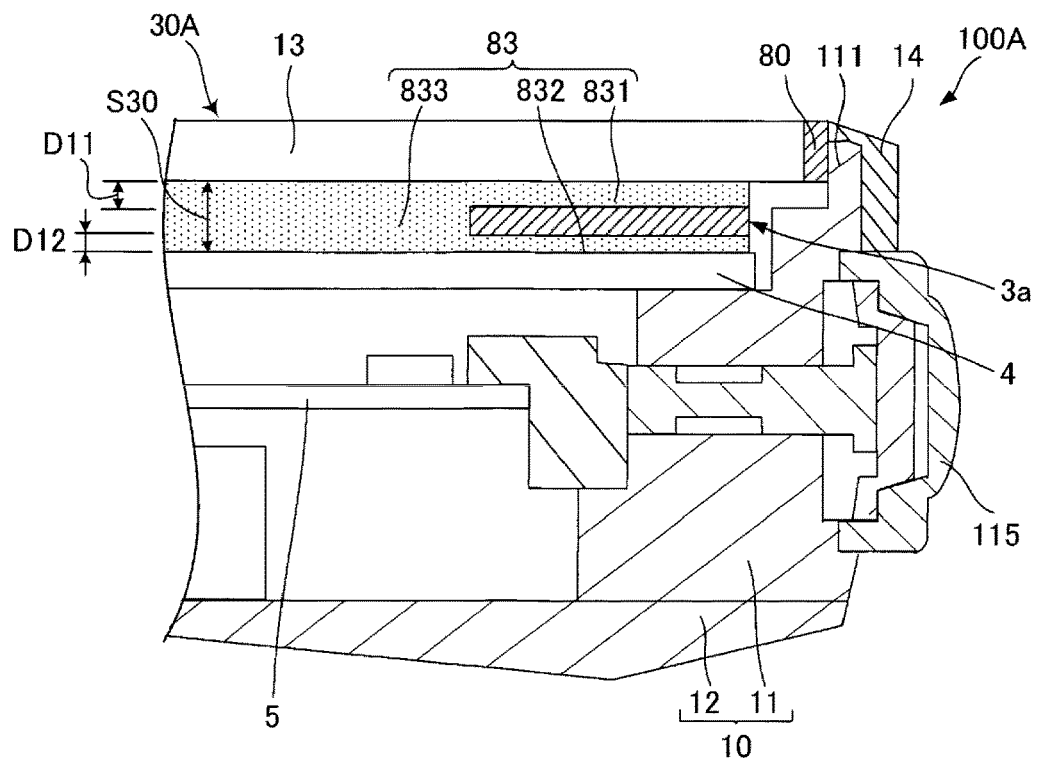
FIG. 8 is another cross-sectional view of the portable electronic device according to the second embodiment.

Next, a second embodiment of the invention will be described. FIGS. 7 and 8 are cross-sectional views of a portable electronic device according to a second embodiment.

This embodiment is similar to the first embodiment described above except that a third adhesive is mainly used instead of the first adhesive and the second adhesive.

In the following description, regarding the second embodiment, differences from the embodiment described above will be mainly described, and description of similar matters will be omitted. In FIGS. 7 and 8, the same reference numerals are given to the same configurations as those in the described above embodiment.

The portable electronic device 100A illustrated in FIG. 7 includes a third adhesive 83 that is an adhesive disposed between the cover member 13 and the display member 4. The third adhesive 83 is disposed so as to fill the portion between the cover member 13 and the display member 4 and joins the solar cell 3 to both the cover member 13 and the display member 4.

As illustrated in FIG. 8, the third adhesive 83 includes a first portion 831 positioned between the solar cell 3 and the cover member 13, a second portion 832 positioned between the solar cell 3 and the display member 4, and a third portion 833 positioned between the cover member 13 and the display member 4 at a position where the solar cell 3 is not interposed. The first portion 831 fills the gap D11 between the solar cell 3 and the cover member 13. The second portion 832 fills the gap D12 between the solar cell 3 and the display member 4. The third portion 833 fills a gap S30 between the solar cell 3 and the display member 4.

The third adhesive 83 is an adhesive having light transmission properties and insulation properties. As the third adhesive 83, the same material as that of the first adhesive 81 in the first embodiment can be used.

As described above, in the portable electronic device 100A, the third adhesive 83 having light transmission properties is provided between the cover member 13 and the display member 4. The third portion 833 of the third adhesive 83 corresponds to an "intermediate material". Therefore, it can be said that the third adhesive 83 has a configuration in which the first adhesive 81, the second adhesive 82, and the "intermediate material" in the first embodiment are integrated.

Since the third adhesive 83 is provided in the gap S30, compared with the case where the gap S30 is a space, rigidity of the structure 30A configured by the cover member 13, the third adhesive 83, the solar cell 3, and the display member 4 can be enhanced. For that reason, even if the thickness of the cover member 13 is made thin, since the cover member 13 can be reinforced by the third adhesive 83, the thickness of the cover member 13 can be made thinner than that of the cover member 13 in the first embodiment. For that reason, it is possible to reduce the weight of the portable electronic device 100. Since the third adhesive 83 is filled in the gap S30, rigidity of the structure 30A can be particularly enhanced.

In addition, although waterproofness of the inner space S is secured by the seal 80, if the space S30 is a space, the cover member 13 may be fogged due to dew condensation due to, for example, an increase in humidity. In contrast, since the third adhesive 83 is provided in the gap S30, fogging of the cover member 13 due to dew condensation can be reduced. Further, since the third adhesive 83 is filled in the gap S30, it is possible to particularly reduce the possibility of fogging of the cover member 13 due to dew condensation.

The difference between the absolute refractive index of the third portion 833 of the third adhesive 83 and the absolute refractive index of the cover member 13 is preferably smaller than the difference between the absolute refractive index of air and the absolute refractive index of the cover member 13.

By satisfying such a relationship, a larger amount of light can be guided to the solar cell 3 as compared with the case where the third adhesive 83 is not provided and the portion between the cover member 13 and the display member 4 is a space, so that the amount of light received by the solar cell 3 can be increased. As in this embodiment, since the third adhesive 83 is filled in the gap S30, the amount of received light can be particularly increased.

The difference between the absolute refractive index of the third portion 833 of the third adhesive 83 and the absolute refractive index of the cover member 13 is preferably 0.3 or less, and more preferably 0.1 or less. When the value of the difference is equal to or less than the values described above, the effect of increasing the amount of received light described above can be exerted particularly remarkably.

Also, according to the second embodiment as described above, impact resistance of the portable electronic device 100A can be enhanced.

First Modification Example

Figure 9:
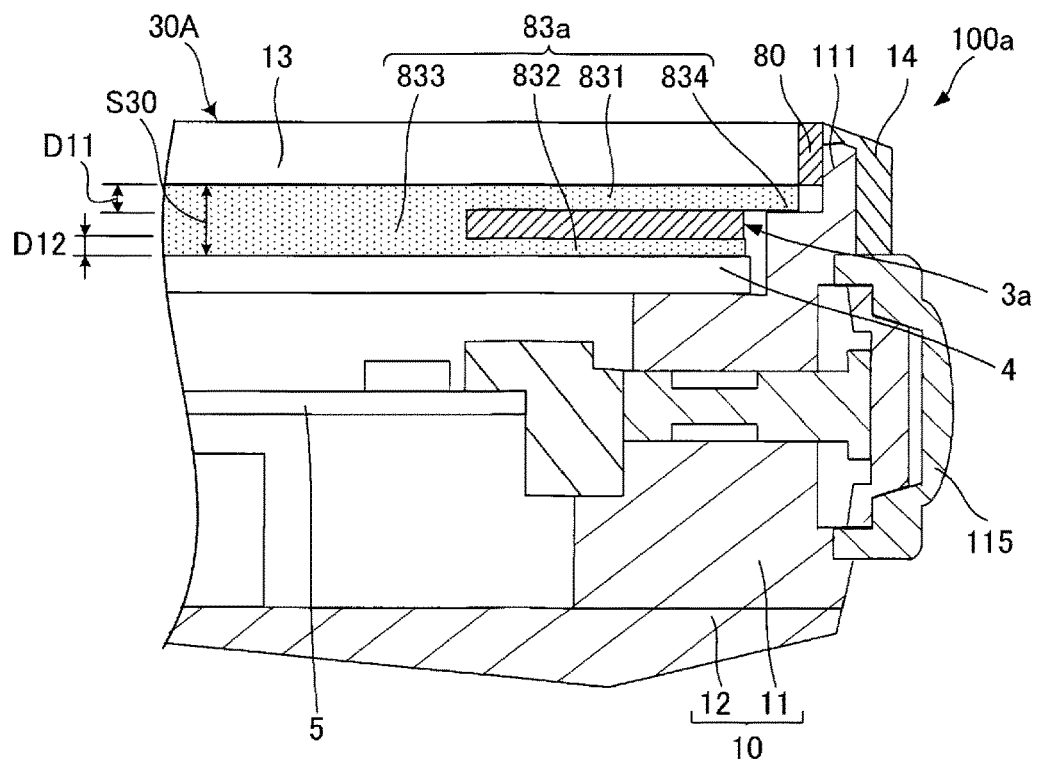
FIG. 9 is a partial cross-sectional view of a portable electronic device according to a first modification example.

FIG. 9 is a partial cross-sectional view of a portable electronic device according to a first modification example. A third adhesive 83a, which is an adhesive included in a portable electronic device 100a illustrated in FIG. 9, has a fourth portion 834 in addition to the first portion 831, the second portion 832, and the third portion 833. The fourth portion 834 joins the display member 4 and the outer case 10 together. The fourth portion 834 is provided between the display member 4 and the outer case 10 and overlaps both the display member 4 and the outer case 10 in a plan view. By including the fourth portion 834, the cover member 13 can be stably fixed to the outer case 10.

Second Modification Example

Figure 10:
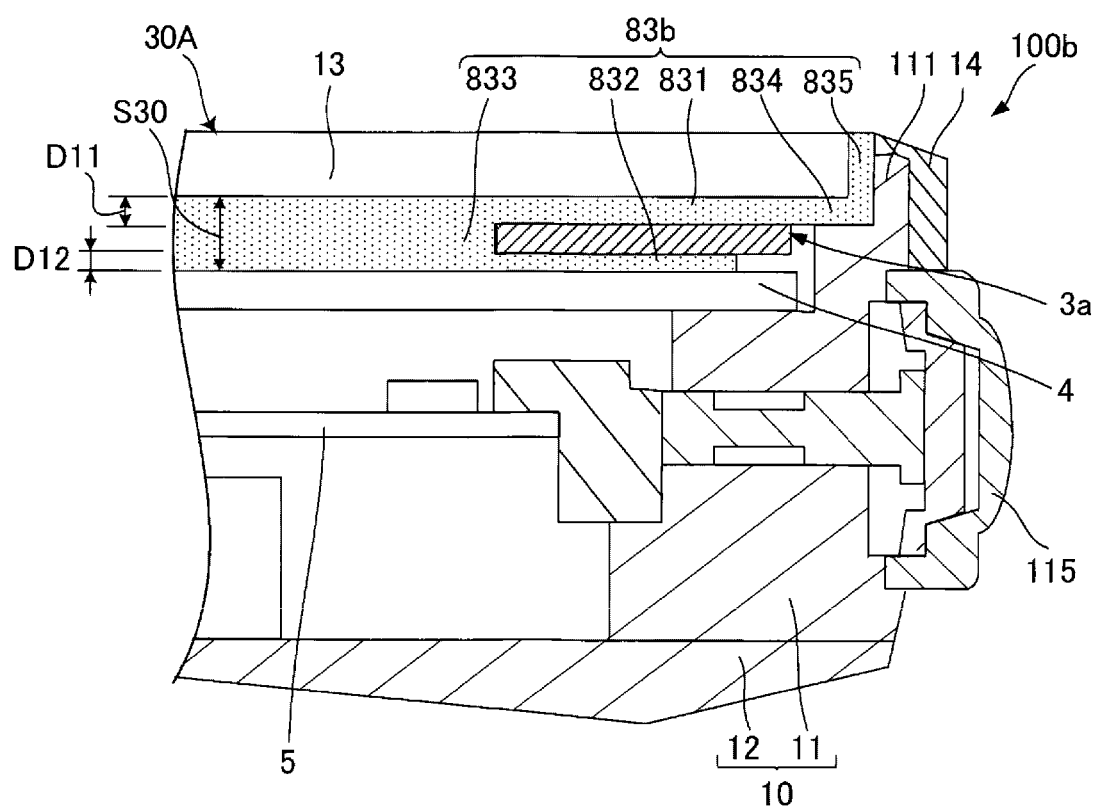
FIG. 10 is a partial cross-sectional view of a portable electronic device according to a second modification example.

FIG. 10 is a partial cross-sectional view of a portable electronic device according to a second modification example. A third adhesive 83b, which is an adhesive included in a portable electronic device 100b illustrated in FIG. 10, includes a fifth portion 835, in addition to the first portion 831, the second portion 832, the third portion 833, and the fourth portion 834. The fifth portion 835 is positioned between the cover member 13 and the protruded portion 111. The fifth portion 835 has a function as a seal for fixing the cover member 13 to the protruded portion 111 and sealing between the cover member 13 and the protruded portion 111. By including the fifth portion 835, the seal 80 in the first embodiment can be omitted. Further, since the fifth portion 835 is provided, the bezel 14 may be omitted.

For example, in a case where the third adhesive 83b is made of ultraviolet curing resin, the first portion 831, the second portion 832, the third portion 833, and the fourth portion 834 of the third adhesive 83b are cured before the structure 30A is assembled into the outer case 10. On the other hand, the fifth portion 835 of the third adhesive 83b is hardened after the structure 30A is assembled into the outer case 10. The fifth portion 835 is hardened by, for example, irradiating the outer peripheral surface of the protruded portion 111 with ultraviolet light. In that case, the protruded portion 111 may be formed of a member having light transmission properties.

In the description described above, the cover member 13 and the first adhesive 81 are configured by separate members, but may be configured by one member. For example, although not illustrated in detail, after disposing the display member 4 and the solar cell 3 in the outer case 10, ultraviolet curable resin is disposed on the display member 4 and the solar cell 3. Thereafter, the ultraviolet curable resin is irradiated with ultraviolet rays to harden at least a portion to be the cover member 13 of the ultraviolet curable resin. A portion, which becomes the first adhesive 81, of the ultraviolet curable resin may be completely cured or semi-cured. By this method, a member in which the cover member 13 and the first adhesive 81 are integrated can be formed.

Although the portable electronic device according to the invention has been described based on the illustrated embodiments, the invention is not limited to these embodiments. Further, the configuration of each unit according to the invention can be replaced with any configuration exhibiting the same function as that in each of the embodiments described above, and an arbitrary configuration can be added.

In the embodiments described above, as an example of the invention, a wrist device that can be worn on the wrist of a user is included, but the invention is not limited to the illustrated configuration as long as the wrist device can be carried by a user. The invention may be a game machine, a mobile phone, or the like. Also, the invention may be a pocket watch type electronic timepiece. In addition, when the invention is wearable on a user's body or the like, a wearing position of the invention to the user is not limited to the wrist, but may be a foot, a head or the like.

What is claimed is:

1. A portable electronic device comprising:
   an outer case having an opening;
   a cover member having light transmission properties and covering the opening; and
   a monocrystalline silicon type solar cell accommodated in the outer case and directly joined to the cover member only by a light transmissive adhesive.

2. The portable electronic device according to claim 1, further comprising:
   a display accommodated in the outer case and displaying information,
   wherein the monocrystalline silicon type solar cell is provided between the display and the cover member, and the display is joined to the monocrystalline silicon type solar cell.

3. The portable electronic device according to claim 2, wherein an intermediate material having light transmission properties is provided between the cover member and the display.

4. The portable electronic device according to claim 3, wherein a difference between an absolute refractive index of the intermediate material and an absolute refractive index of the cover member is smaller than a difference between an absolute refractive index of air and the absolute refractive index of the cover member.

5. The portable electronic device according to claim 1, wherein the monocrystalline silicon type solar cell includes a first monocrystalline silicon type solar cell and a second monocrystalline silicon type solar cell, and the first monocrystalline silicon type solar cell and the second monocrystalline silicon type solar cell are separated from each other.

6. The portable electronic device according to claim 2, wherein the monocrystalline silicon type solar cell includes a first monocrystalline silicon type solar cell and a second monocrystalline silicon type solar cell, and the first monocrystalline silicon type solar cell and the second monocrystalline silicon type solar cell are separated from each other.

7. The portable electronic device according to claim 3, wherein the monocrystalline silicon type solar cell includes a first monocrystalline silicon type solar cell and a second monocrystalline silicon type solar cell, and the first monocrystalline silicon type solar cell and the second monocrystalline silicon type solar cell are separated from each other.

8. The portable electronic device according to claim 4, wherein the monocrystalline silicon type solar cell includes a first monocrystalline silicon type solar cell and a second monocrystalline silicon type solar cell, and the first monocrystalline silicon type solar cell and the second monocrystalline silicon type solar cell are separated from each other.

9. The portable electronic device according to claim 1, wherein a difference between an absolute refractive index of the adhesive and an absolute refractive index of the cover member is smaller than a difference between an absolute refractive index of air and the absolute refractive index of the cover member.

10. The portable electronic device according to claim 2, wherein a difference between an absolute refractive index of the adhesive and an absolute refractive index of the cover member is smaller than a difference between an absolute refractive index of air and the absolute refractive index of the cover member.

11. The portable electronic device according to claim 3, wherein a difference between an absolute refractive index of the adhesive and an absolute refractive index of the cover member is smaller than a difference between an absolute refractive index of air and the absolute refractive index of the cover member.

12. The portable electronic device according to claim 4, wherein a difference between an absolute refractive index of the adhesive and the absolute refractive index of the cover member is smaller than the difference between the absolute refractive index of air and the absolute refractive index of the cover member.

13. The portable electronic device according to claim 5, wherein a difference between an absolute refractive index of the adhesive and an absolute refractive index of the cover member is smaller than a difference between an absolute refractive index of air and the absolute refractive index of the cover member.

14. The portable electronic device according to claim 1, further comprising:
   a battery accommodated in the outer case; and
   a circuit board accommodated in the outer case and disposed between the cover member and the battery.

15. The portable electronic device according to claim 2, further comprising:
   a battery accommodated in the outer case; and
   a circuit board accommodated in the outer case and disposed between the display and the battery.

16. The portable electronic device according to claim 3, further comprising:
   a battery accommodated in the outer case; and
   a circuit board accommodated in the outer case and disposed between the cover member and the battery.

17. The portable electronic device according to claim 4, further comprising:
   a battery accommodated in the outer case; and
   a circuit board accommodated in the outer case and disposed between the cover member and the battery.

18. The portable electronic device according to claim 5, further comprising:
   a battery accommodated in the outer case; and
   a circuit board accommodated in the outer case and disposed between the cover member and the battery.

\* \* \* \* \*